United States Patent [19]
Hurley

[11] Patent Number: 4,864,242
[45] Date of Patent: Sep. 5, 1989

[54] AUTOMATIC FIELD WINDING GROUND DETECTOR AND LOCATOR

[75] Inventor: Joseph D. Hurley, Casselberry, Fla.

[73] Assignee: Westinghouse Electric Corp., Pittsburgh, Pa.

[21] Appl. No.: 240,283

[22] Filed: Sep. 6, 1988

[51] Int. Cl.$^4$ .................. G01R 31/06; G01R 31/34
[52] U.S. Cl. .................... 324/510; 324/522; 324/546; 324/511; 324/545; 324/158 MG
[58] Field of Search .............. 324/158 MG, 546, 547, 324/545, 522, 544, 509, 510, 571; 340/648, 650; 322/99

[56] References Cited

U.S. PATENT DOCUMENTS

| | | | |
|---|---|---|---|
| 3,727,123 | 4/1973 | Smith | 322/99 |
| 3,757,169 | 9/1973 | Beresnikow | 317/18 R |
| 4,525,665 | 6/1985 | Smalley | 340/650 |
| 4,551,811 | 11/1985 | Taniguti | 364/481 |
| 4,672,501 | 6/1987 | Bilac et al. | 361/96 |
| 4,679,111 | 7/1987 | Koch et al. | 361/31 |
| 4,812,751 | 3/1989 | Roberts et al. | 324/546 |

Primary Examiner—Reinhard J. Eisenzopf
Assistant Examiner—Anthony L. Miele

[57] ABSTRACT

A system for detecting and locating a ground fault (34) in the field winding (2) of a machine, in which a DC potential is present across the winding (2) during machine operation and the winding (2) is normally insulated from ground, the system including: a voltage divider (4) connectable in parallel with the winding (2) and having a plurality of tap points spaced apart along the divider (4); a plurality of current paths (6, 8, 14) each connected between a respective tap and a ground connection point (16); a current detector (12) connected in the current paths (6, 8, 14) for providing an indication of the magnitude of current flowing through each path (6, 8, 14); and signal processing circuitry (20, 22, 24) connected to the current detector (12) for providing an indication of the occurrence of a current flow magnitude associated with a ground fault (34) in the field winding (2) and an indication of at least the approximate location of the ground fault (34) along the winding (2).

7 Claims, 2 Drawing Sheets

AUTOMATIC FIELD WINDING GROUND DETECTOR AND LOCATOR

BACKGROUND OF THE INVENTION

The present invention relates to a system for monitoring the field winding of a rotating electric machine, particularly for the purpose of detecting the presence and location of a ground fault.

The field winding of a rotating electric machine, such as a synchronous machine, is designed and installed to be substantially fully insulated from ground during operation. However, a ground fault can develop at any time in the winding, due to an insulation breakdown, for example. It is important that the machine operator become immediately aware of such ground fault condition so that the machine can be shut down in order to perform appropriate repair. Although a single ground fault may not cause damage, the occurrence of a second ground fault can result in the flow of extremely large currents, causing severe machine damage.

Various systems for detecting such ground faults are already known. Thus, there exist AC detection systems in which an AC voltage is supplied between ground and one of the field winding terminals through a resistor. If no significant current flow through the resistor is detected, it can be concluded that no field ground exists. However, if a field ground does occur at any point along the length of the field winding, the current flow through the resistor will provide an indication of this condition.

According to one known DC detection method, two fixed value resistors are connected in series across the field winding so that the potential drop across the winding also appears across the resistors. The point of connection between the two resistors is connected to ground through a further resistor and a current detector. Under normal conditions, when the field winding is energized and no ground fault exists, substantially no current will flow through the further resistor and the current detector. However, if a ground fault should occur, the resulting current flow through the detector will provide an indication of that condition. However, this arrangement will not produce an indication if the ground fault occurs in a region of the field winding which, during normal operation, is at a potential corresponding to that of the connection point between the two series resistors. In order to deal with this problem, the circuit includes an auxiliary resistor which the operator can connect across one of the series resistors by means of a push button in order to temporarily shift the potential at the point of connection between the series resistors.

According to another known technique, which is comparable to the DC method described above, one of the series resistors has a nonlinear resistance variation with voltage so that as the field winding voltage varies, the potential at the point of connection between the series resistors also varies, thereby helping to detect a ground at any point along the length of the field winding. However, there are certain operating conditions, such as when the machine is base loaded, under which the winding voltage does not vary significantly over long periods of time.

The AC detection method has the disadvantage that it imposes an AC voltage on the field winding and this voltage can induce varying levels of non-ground currents due to the normal capacitive coupling of the field winding to ground. While the known DC detection methods overcome this drawback, they cannot, without operator intervention, detect ground faults at every point along the length of the field winding.

Moreover, none of the known techniques provides any information as to the location of a ground fault. If the existence of a ground fault is observed, using these known techniques, it is necessary to shut the machine down to locate that fault. However, this is not always possible because there are situations in which a ground fault may be apparent while the machine is in operation, but cannot be located after the machine has been shut down.

SUMMARY OF THE INVENTION

It is an object of the present invention to provide a novel monitoring system which avoids the disadvantages of known systems.

Another object of the invention is to provide a system which will operate continuously while the associated machine is on-line and will provide a direct indication of both the existence of a ground fault and at least its approximate location along the length of the field winding.

Another object of the invention is to provide these advantages in a system which is powered by the DC potential across the field winding.

The above and other objects are achieved, according to the present invention, by a system for detecting and locating a ground fault in the field winding of a machine, in which a DC potential is present across the winding during machine operation and the winding is normally insulated from ground, the system comprising:

a voltage divider connectable in parallel with the winding and having a plurality of tap points spaced apart along the divider;

means defining a plurality of current paths each connected between a respective tap add a ground connection point;

current detector means connected in the current paths for providing an indication of the magnitude of current flowing through each path; and signal processing means connected to the current detector means for providing an indication of the occurrence of a current flow magnitude associated with a ground fault in the field winding and an indication of at least the approximate location of the ground fault along the winding.

DESCRIPTION OF THE PREFERRED EMBODIMENTS

Figure 1:
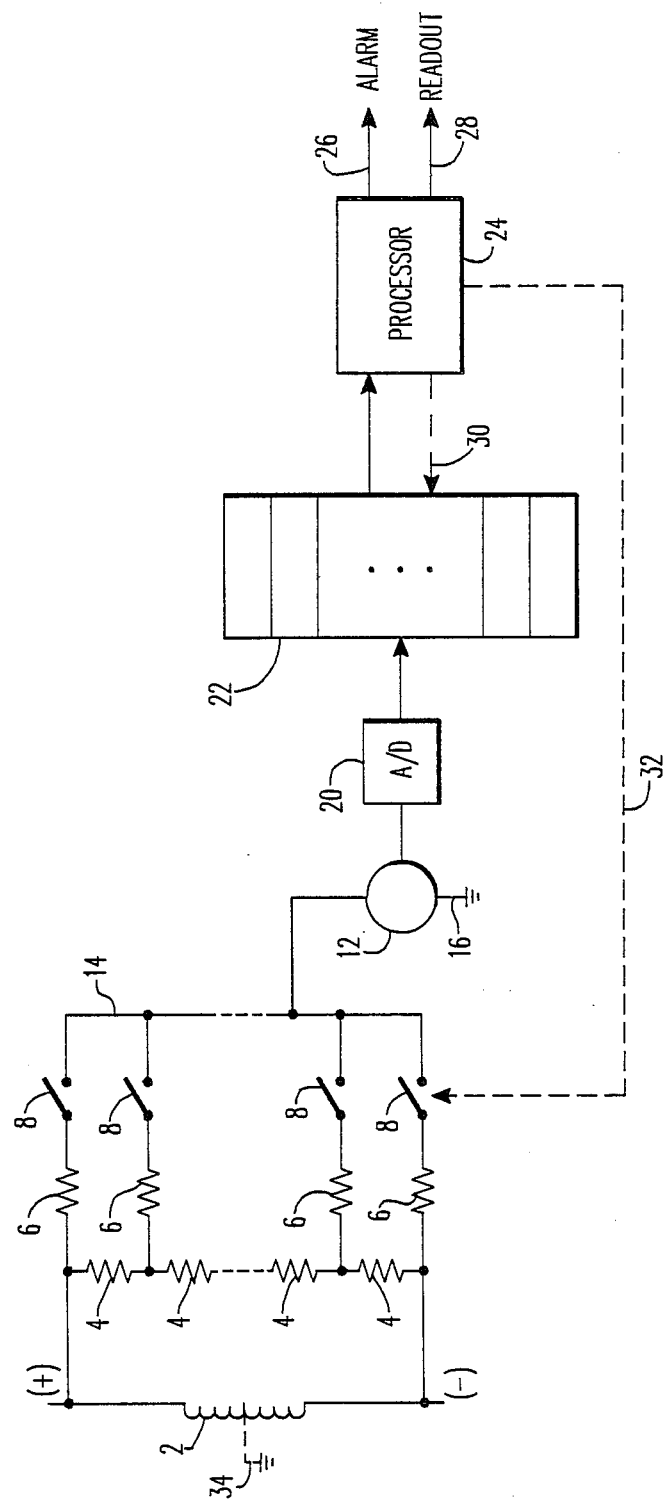
FIG. 1 is a circuit diagram of a preferred embodiment of a detector and locator circuit according to the present invention.

FIG. 1 illustrates one preferred embodiment of a detector and locator circuit according to the present invention for monitoring a field winding 2 across which a DC potential normally exists. The winding itself and the source of winding potential are, in normal operation, isolated from ground, although it will be appreciated that a finite, but large, resistance will normally exist between winding 2 and ground through the winding insulation.

The circuit according to the invention includes a voltage divider, composed of a series of preferably identical resistors 4, connected across winding 2. The number, N, of resistors 4 depends on the length of winding 2 and the desired precision with which the location of a ground fault is to be indicated. In any event, N will be substantially greater than 2 and could typically be of the order of 10.

Each end of the voltage divider and each point of connection between two adjacent resistors 4 is connected to one end of a respective series resistor 6. Each resistor 6 is connected in series with a respective electronically controllable two-pole switch 8 and the other side of each switch 8 is connected to one side of a DC current detector 12 via a common line 14, detector 12 being connected between line 14 and circuit ground 16.

The current reading produced by detector 12 is supplied to an analog/digital converter 20 the digital output of which is conducted to a storage register 22 having a number of storage locations equal to the number of switches 8.

Register 22 has an output connected to a processor 24 which is provided with an alarm output line 26 and a readout line 28, as well as a register control bus 30 and a switch control bus 32.

The circuit according to the invention is employed to continuously monitor field winding 2 during operation of the machine in which that winding is disposed. As indicated above, as long as no ground fault is associated with winding 2, it, including its connecting lines, will be essentially isolated from ground.

Monitoring is effected under control of processor 24, which supplies signals via bus 32 to close each switch 8 in succession, only one switch 8 being closed at a time and for a period sufficient to allow detector 12 to produce an accurate indication of the current flowing through the closed switch 8 and its associated resistor 6. The readings produced by detector 12 are continuously converted to digital form by converter 20 and the digital representation of the reading produced by detector 12 during closing of each switch 8 is written into a corresponding location of register 22 under control of address signals supplied by bus 30.

After every switch 8 has been closed, input to register 22 is temporarily blocked and each register location is then read out in succession to processor 24 under control of a readout signal and location address signals supplied via bus 30. The current readings are processed in processor 24 and are read out via line 28. If one of the current readings indicates the existence of a ground fault 34, an alarm signal is generated on line 26.

When no ground fault exists, so that winding 2 and its current leads are isolated from ground, the closing of a switch 8 will not complete a circuit path, so that any current flow through the closed switch will be at a very low level. Such a low level current flow will be interpreted by processor 24 as indicating the absence of any ground fault, so that no alarm signal will be produced.

If, on the other hand, a ground fault 34 does exist, then upon closing of each switch 8, a current flow circuit will be completed, through detector 12, resulting in a substantially higher current flow through at least some of switches 8. This higher current flow, when supplied to processor 24, will produce an alarm signal. Moreover, as will be explained in greater detail below, the current readings supplied to read out line 28 will enable at least the approximate location of ground fault 34 along the length of winding 2 to the determined.

The voltage divider constituted by resistors 4 divides the potential across winding 2 into substantially equal increments, corresponding to potential increments along the length of winding 2. The potential at each connection point between two resistors 4 will therefore correspond to the potential at a respective point along the length of winding 2. If a ground fault 34 should exist, this will bring one point along the length of winding 2 to ground potential. Therefore, a corresponding point along the length of the voltage divider formed by resistors 4 will also be approximately at ground potential. The potential at every other connection point of the voltage divider will differ from ground potential by an amount corresponding to the number of resistors 4 separating that point from the voltage divider point which is at least approximately at ground potential. Therefore, the further the voltage divider point from the point which is at ground potential, the higher will be the current flow from that voltage divider point when the associated switch 8 is closed. Correspondingly, when the switch 8 connected to the voltage divider point which is at least approximately at ground potential is closed, the current flow through the closed switch 8 will have a minimum value.

Therefore, if a ground fault 34 should exist, the location in register 22 of the minimum current reading will correspond at least approximately to the location along winding 2 of the ground fault. Thus, examination of the current readings supplied to line 28 will permit identification of the ground fault location.

Figure 2:
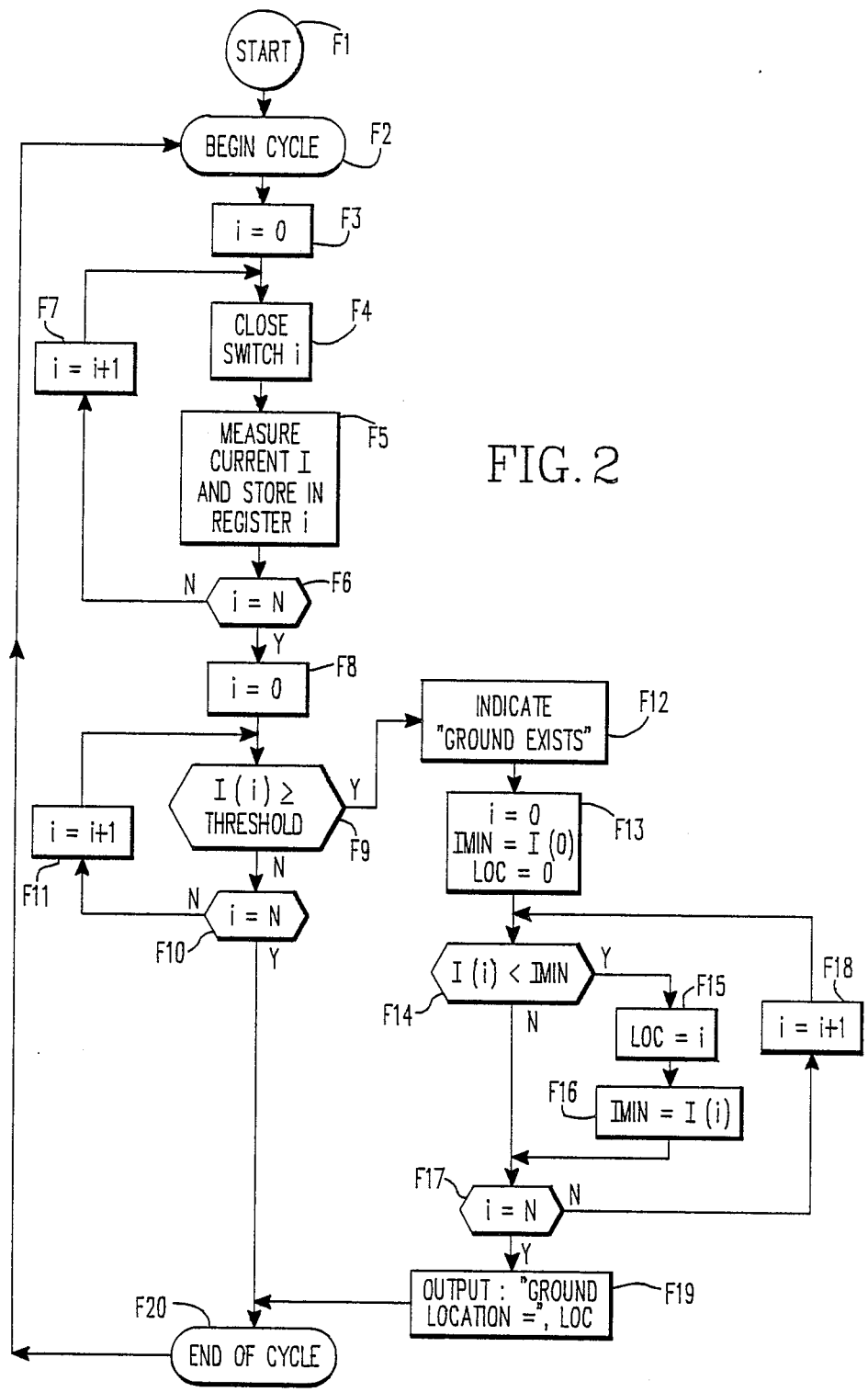
FIG. 2 is a programming flow diagram illustrating a monitoring sequence employed with the circuit of FIG. 1.

The manner in which a set of current readings stored in register 22 can be examined in order to identify the presence of a ground fault and to localize that ground fault is depicted in the programming flow diagram of FIG. 2, which is composed of blocks F1 to F20 and which relates to a device containing N+1 switches 8.

In FIG. 2: i=the number of a register location, corresponding to the point of connection of a respective resistor 6 to the voltage divider; I (i)=current at location i; I (0)=current at location 0 (zero); and $I_{min}$=the minimum current detected during interrogation of successive register locations.

As FIG. 2 indicates, each switch $8i$ (i=0, 1, 2 ... N) is closed in turn and the current flowing through the closed switch is measured and stored in a respective location of register 22. After this process has been carried out for all switches 8, each register location is interrogated to determine whether the current representation stored therein corresponds to a current value equal to or greater than a predetermined threshold value. If none of the values stored in register 22 satisfies this condition, then the readout cycle is completed and a new measuring cycle is started.

If the existence of a ground fault is noted, then, in a subroutine, each register location is again interrogated to identify that location which contains the smallest current amplitude representation. The identity of that location provides an indication of the location of the ground fault.

Resistors 6 have substantially higher resistances than do resistors 4 and the resistances of resistors 6 are basically selected to produce a current, in the event of a ground fault condition, in the preferred operating range of detector 12.

While the description above shows particular embodiments of the present invention, it will be understood that many modifications may be made without departing from the spirit thereof. The pending claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed:

1. A system for detecting and locating a ground fault in the field winding of a machine, in which a DC potential is present across the winding during machine operation and the winding is normally insulated from ground, said system comprising:
   a voltage divider connectable in parallel with the winding and having a plurality of tap points spaced apart along said divider;
   means defining a plurality of current paths each connected between a respective tap and a ground connection point;
   current detector means connected in said current paths for providing an indication of the magnitude of current flowing through each said path; and
   signal processing means connected to said current detector means for providing an indication of the occurrence of a current flow magnitude associated with a ground fault in the field winding and an indication of at least the approximate location of the ground fault along the winding.

2. A system as defined in claim 1 wherein said signal processing means comprise: control means operatively associated with said current paths for causing said current detector means to provide an indication of the magnitude of current flowing through each said path in succession; and signal storage means for storing a representation of the indication produced by said current detector means for each said path.

3. A system as defined in claim 2 wherein said signal processing means further comprise signal evaluating means connected for receiving representations stored in said signal storage means and for producing a fault signal upon receipt of a representation of an indication of a current flow magnitude associated with a ground fault in the field winding.

4. A system as defined in claim 3 wherein said signal storage means comprise a plurality of storage locations each associated with a respective current path, and said signal evaluating means are operative, in response to production of a fault signal, for identifying the storage location storing the representation of the lowest current magnitude indication.

5. A system as defined in claim 4 wherein each said current flow path contains a controllable switch connected in series in its associated path, and said control means are operatively connected to said switches and said signal storage means for closing said switches individually and in succession and for causing the representation stored in each said memory location to correspond to the indication being provided by said current detector means when a respective switch is closed.

6. A system as defined in claim 5 wherein said current detector means comprise an analog current detector, said signal storage means and signal evaluating means comprise digital devices, and said signal processing means further comprise an analog/digital converter connected between said current detector means and said signal storage means.

7. A system as defined in claim 6 wherein said voltage divider comprises a plurality of resistors having substantially identical resistances and connected together in series so that each connection point between resistors constitutes a respective tap point, and each said current path comprises a respective further resistor having a resistance which is substantially higher than the resistance of each said resistor of said voltage divider.

* * * * *